United States Patent [19]
Kikuchi et al.

[11] Patent Number: 4,623,754
[45] Date of Patent: Nov. 18, 1986

[54] ELEMENT INSTALLATION ARRANGEMENT FOR INSTALLING AN ELEMENT IN A FLYBACK TRANSFORMER

[75] Inventors: Akihiro Kikuchi, Nagaokakyo; Tosimi Miyagi, Kusatsu, both of Japan

[73] Assignee: Murata Manufacturing Co., Ltd., Japan

[21] Appl. No.: 711,993

[22] Filed: Mar. 14, 1985

[30] Foreign Application Priority Data

Mar. 15, 1984 [JP] Japan .................................. 59-50384

[51] Int. Cl.[4] ........................ H05K 7/02; H01F 27/40
[52] U.S. Cl. .................................. 174/52 R; 336/192; 336/208; 363/68; 363/126
[58] Field of Search ........................ 338/318, 319, 320; 363/68, 126; 361/400, 417, 419, 427; 336/192, 185, 208; 174/52 R

[56] References Cited

U.S. PATENT DOCUMENTS 4,419,536 12/1983 Doyle et al. .................... 336/192 X
4,429,358 1/1984 Miyagi ............................ 336/185 X

*Primary Examiner*—Thomas J. Kozma
*Attorney, Agent, or Firm*—Ostrolenk, Faber, Gerb & Soffen

[57] ABSTRACT

A flyback transformer includes a bobbin and first and second holders mounted on the bobbin in a predetermined spaced relationship with each other, for holding a circuit element such as a diode. The first holder has a first surface facing the second holder and a first step formed between the first surface and the bobbin. Similarly, the second holder has a second surface facing the first holder and a second step formed between the second surface and the bobbin. Thus, the element is pressure fitted between the first and second surfaces with the opposite ends of the element being seated on the first and second steps.

10 Claims, 8 Drawing Figures

ELEMENT INSTALLATION ARRANGEMENT FOR INSTALLING AN ELEMENT IN A FLYBACK TRANSFORMER

BACKGROUND OF THE INVENTION

1. Field of the Invention

The present invention relates to a flyback transformer and, more particularly, to an element installation arrangement for installing an element, such as a diode, used therein.

2. Description of the Prior Art

The flyback transformer is used, for example, in a television receiver or CRT display apparatus for supplying a high DC voltage to a cathode ray tube for the acceleration of the electron beam and, for this purpose, a number of diodes are provided in the flyback transformer so as to rectify the output voltage of the secondary windings.

An example of a prior art flyback transformer is shown in FIG. 1, which comprises inner bobbin 3 and outer bobbin 11. Inner bobbin 3 is integrally formed with a base portion 2 mounted with a plurality of pins 1. Primary winding 4 and tertiary winding 5 are wound on inner bobbin 3. Outer bobbin 11 has a plurality of flanges defining a coil groove 9 and a separation groove 10. A secondary winding 12, which is divided into a plurality of sections 12*a*, is wound on outer bobbin 11 such that each coil section is wound in coil groove 9. The coil sections are connected in series through diodes 15, each supported by an installation arrangement defined by a pair of holders 26 and 27 provided in separation groove 10.

Inner bobbin 3 is inserted into outer bobbin 11 and both bobbins are accommodated in a casing 16 made of electric insulation material, such as synthetic resin. After locating the bobbins inside casing 16, molten synthetic resin (not shown) is filled in, which becomes hard in a short period of time. Thereafter, a pair of U-shaped ferrite cores 17 and 18 are mounted to define an O-shaped core unit such that a portion of the O-shaped core unit extends through inner bobbin 3. The O-shaped core unit is provided for forming a magnetic circuit for the magnetic flux generated by the windings.

An equivalent circuit of the flyback transformer is shown in FIG. 2 which clearly shows that secondary winding 12 is defined by the serial connection of coil sections 12*a* through diodes 15. One end of secondary winding 12 is grounded through a pin 21 and the other end thereof is connected through a diode to a line 22 which will carry a high voltage.

According to the prior art flyback transformer, such as disclosed in Japanese Utility Model Laid-open Publication No. 118024/1978 entitled "Flyback Transformer" and issued Sept. 20, 1978, each diode 15 is supported by a pair of holders 26 and 27, such as shown in FIG. 3. Holders 26 and 27 are located on outer bobbin 11, and they extend from the bottom of separation groove 10. A distance between a pair of holders 26 and 27 is a little longer than the length of diode 15 measured in the axial direction. Holders 26 and 27 have grooves 26*a* and 27*a*, respectively, at their ends remote from the ends connected to the bottom of separation groove 10. The width of each of grooves 26*a* and 27*a* is slightly narrower than the diameter of lead wire 15*a* or 15*b* extending in opposite directions from the body of diode 15. Accordingly, the diode 15 is supported such that lead wires 15*a* and 15*b* are pressure fitted in grooves 26*a* and 27*a*, respectively.

In this case, a problem arises when mounting the diodes on holders 26 and 27 such that a pushing force applied to the diode may result in an undesirable bending of lead wires 15*a* and 15*b* at the neck thereof where it is connected to the body of the diode. Since the holders support not the diode body itself, but the lead wires extending from the diode body, a diode with such a bent lead wire may be mounted in an offset position between holders 26 and 27. For example, the diode body may be raised above the holder, or it may be pushed down close to the bottom of separation goove 10, as indicated by a broken line in FIG. 4. When this happens, a space between the diode body and the wall of the casing, or a space between the diode body and the bottom of separation groove 10, becomes very narrow. Thus, when the molten resin is injected, it can not flow through such a narrow space, resulting in undesirable air bubbles around the diode body. Thus, the insulation breakdown of the diode becomes poor.

To eliminate such a disadvantage, each of the diodes must be checked after it is mounted on a pair of holders.

Furthermore, as shown in FIG. 4, according to the prior art flyback transformer, the distance L1 between holders 26 and 27 is made slightly longer than the length K of the diode body so as to facilitate the mounting of each diode between holders 26 and 27. Furthermore, the thickness T of each holder is made comparatively thick so as to ensure the rigid support of diode 15 between holders 26 and 27. Accordingly the total distance L2 occupied by a pair of holders 26 and 27 is relatively large, resulting in the large size of outer bobbin, and in turn, the large size of flyback transformer.

SUMMARY OF THE INVENTION

The present invention has been developed with a view to substantially solving the above described disadvantages and has for its essential object to provide a transformer having an improved arrangement for supporting diodes employed therein.

It is also an essential object of the present invention to provide a flyback transformer in which undesirable air bubbles around diodes can be eliminated.

It is a further object of the present invention to provide a flyback transformer of the above described type which is compact in size.

In accomplishing these and other objects, an element installation arrangement for installing an element in a flyback transformer comprises first and second holders mounted on the bobbin in a predetermined spaced relationship with each other. The first holder has a first surface facing the second holder and a first step formed between the first surface and the bobbin. Similarly, the second holder has a second surface facing the first holder and a second step formed between the second surface and the bobbin. Thus, the element is pressure fitted between the first and second surfaces with the opposite ends of the element being seated on the first and second steps.

BRIEF DESCRIPTION OF THE DRAWINGS

These and other objects and features of the present invention will become apparent from the following description of a preferred embodiment thereof with reference to the accompanying drawings, throughout which like parts are designated by like reference numerals, and in which.

DESCRIPTION OF THE PREFERRED EMBODIMENTS

Figure 5:
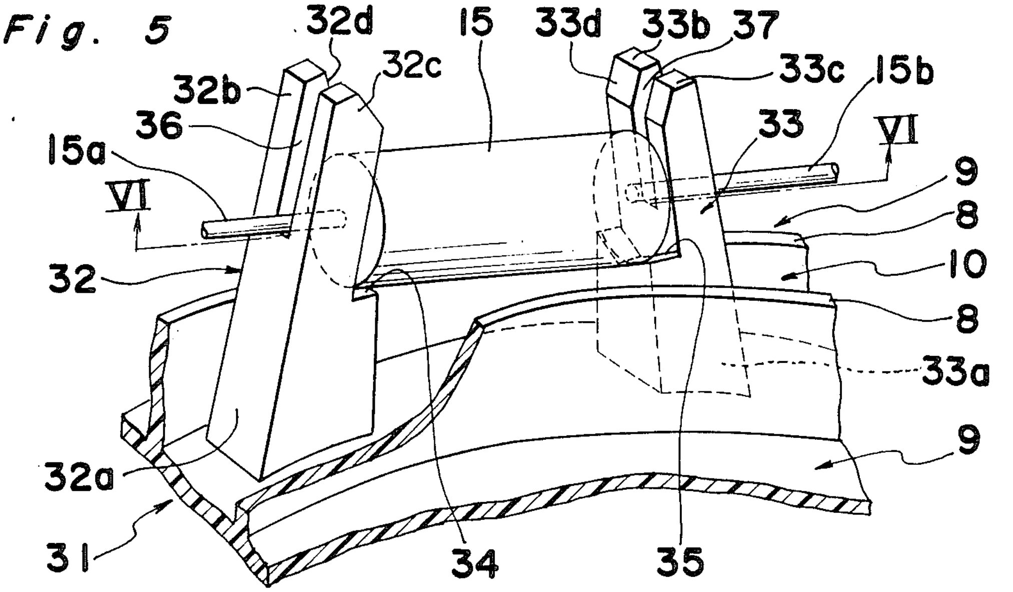
FIG. 5 is a fragmentary perspective view showing an arrangement of holders according to a preferred embodiment of the present invention.
Figure 6:
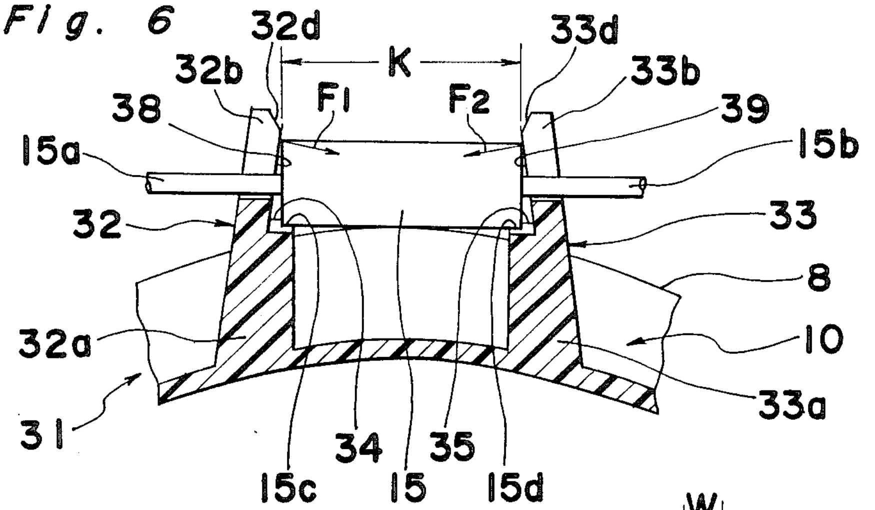
FIG. 6 is a cross-sectional view taken along a line VI—VI shown in FIG. 5.

Referring to FIGS. 5 and 6, outer bobbin 31 has a plurality of flanges 8 defining a coil groove 9 and a separation groove 10.

It is to be noted that outer bobbin 31 is provided for mounting a secondary winding divided into sections, each coil section mounted on respective coil groove 9, in the same manner described above in connection with FIG. 1.

According to the present invention, an installation arrangement for installing an element is defined by a pair of holders 32 and 33 which are provided in a separation groove 10. The element held in the installation arrangement is a diode 15 through which the coil sections are connected in series. Diode 15 is defined by a diode body and a pair of lead wires 15*a* and 15*b* extending outwardly and coaxially from the diode body.

Holder 32 is defined by a base portion 32*a* and a pair of arms 32*b* and 32*c* extending parallelly and upwardly from the base portion, thereby defining a groove 36 between arms 32*b* and 32*c*. Arms 32*b* and 32*c* have surfaces which are in common with each other to define a holding face 38 (FIG. 6), which faces the other holder 33. Below the holding face 38, base portion 32*a* is provided with a step 34 in a V-shaped recess. Furthermore, face 38 of arms 32*b* and 32*c* is so slanted that the distance between holders 32 and 33 becomes narrower towards the free ends of arms 32*b* and 32*c*. The upper end of arms 32*b* and 32*c* are provided with a slanted face 32*d* so that the entrance for the entering diode is widened.

Similarly, holder 33 is defined by a base portion 33*a* and a pair of arms 33*b* and 33*c* defining a groove 37. Base portion 33*a* is formed with a V-shaped step 35 and a face (FIG. 6) of arms 33*b* and 33*c* facing the other holder 32 is slanted.

It is to be noted that the distance between faces 38 and 39 is slightly shorter than the length K of the diode and is gradually increased towards respective base portions 32*a* and 33*a*.

Figure 7:
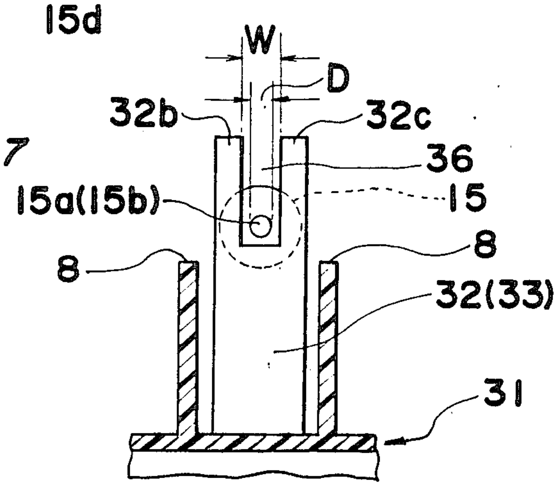
FIG. 7 is a front elevation view of a holder according to the present invention.

Referring to FIG. 7, the width W of groove 36 or 37 is wider than the diameter D of lead wire 15*a* or 15*b* extending coaxially from the diode body. Accordingly, grooves 36 and 37 are provided merely to guide the lead wires. The firm securing and supporting of the diode is done in a manner described below.

The diode is inserted between holders 32 and 33 by the application of pressure to the diode body towards bobbin 31 until bottom edges 15*c* and 15*d* of the diode body are seated on steps 34 and 35, respectively. Since the distance between faces 38 and 39 at the upper end thereof is slightly shorter than the length K, the upper end of the diode is tightly held between arms 32*b* and 33*b* and also between arms 32*c* and 33*c*, by the resiliency of the arms which are made of, e.g., nolyl resin. Since the faces 38 and 39 are slanted, the holding pressures F1 and F2 do not direct towards each other, but diagonally towards about the center of opposite end face of the diode body. Accordingly, the downward vector components of vectors F1 and F2 provide depressing force to the diode body, thereby tightly pressing the diode body against V-shaped steps 34 and 35. More specifically, a bottom edge 15*c* of the diode is held, by pressure, against step 34, and a bottom edge 15*d* is held, by pressure, against step 35.

Furthermore, since steps 34 and 35 are cut in V-shape, the diode can be positioned properly at the center, no matter whether lead wire 15*a* or 15*b* is bent, or not.

According to the present invention, a space between face 38 (or 39) and the corresponding end face of the diode body is not as wide as the prior art. Furthermore, the arms have a thickness sufficient to produce biasing forces F1 and F2 and, therefore, they can be made comparatively thin. Also, the base portions are partly located under the diode body. Accordingly, the total distance between holders 32 and 33, including their thickness, can be made comparatively narrow, resulting in a small size of the flyback transformer.

Figure 8:
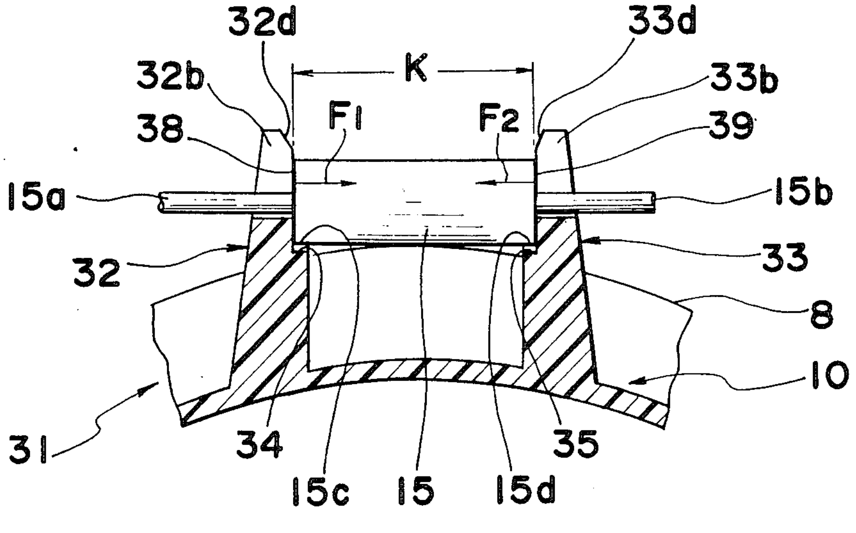
FIG. 8 is a view similar to FIG. 6, but particularly showing a modification thereof.
Figure 3:
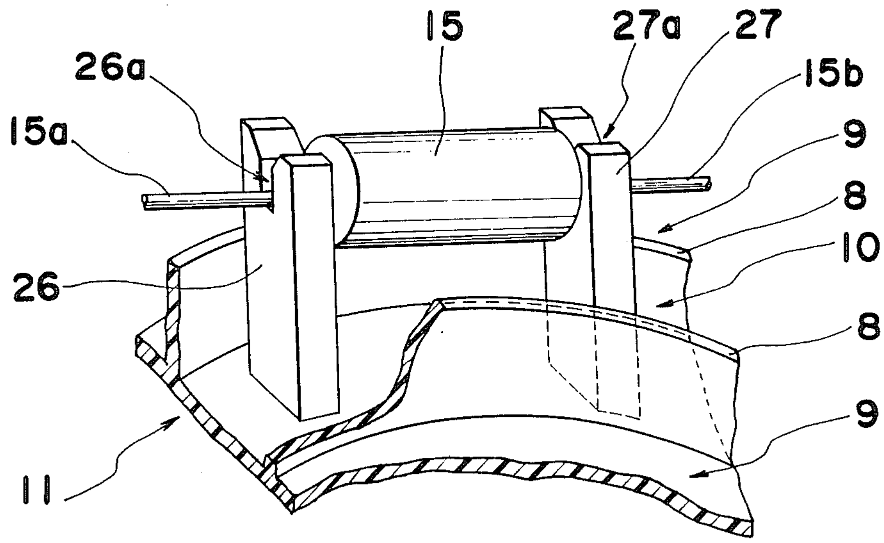
Fig. 3 PRIOR ART
FIG. 3 is a fragmentary perspective view showing an arrangement of holders for holding a diode, according to the prior art.
Figure 4:
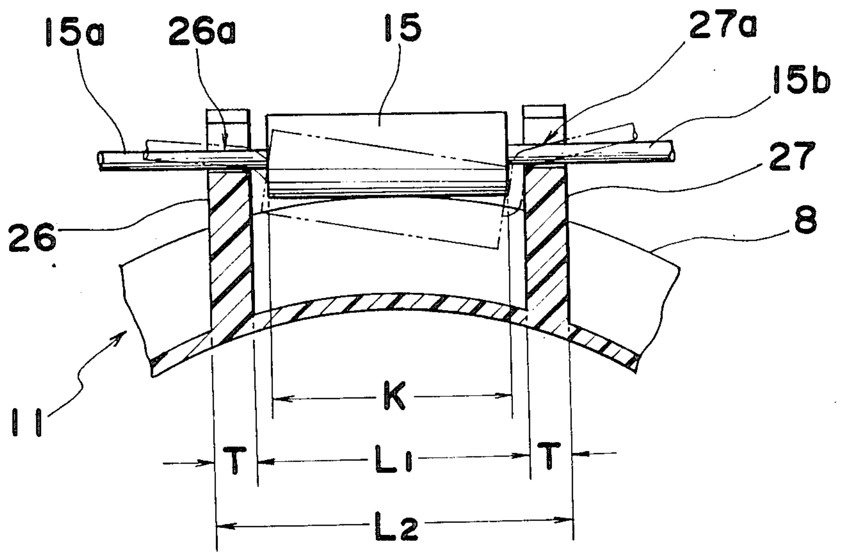
Fig. 4 PRIOR ART
FIG. 4 is a cross-sectional view of the prior art holders of FIG. 3.

Referring to FIG. 8, a modification is shown. Instead of making faces 38 and 39 slanted, they can be made more parallel to each other so as to effect a face contact, by pressure, between face 38 and one end face of the diode body and face 39 and the other end face of the same. In this case, the forces F1 and F2 direct approximately towards each other.

It is to be noted that one of the faces 38 and 39 can be made slanted, and the other face can be made upright.

In the above described embodiment and modification, the recess formed in step 34 and 35 can be other than V-shaped recess, such as an arcuate recess or a polygonal recess. Furthermore, step 34 and 35 can be made flat.

Figure 1:
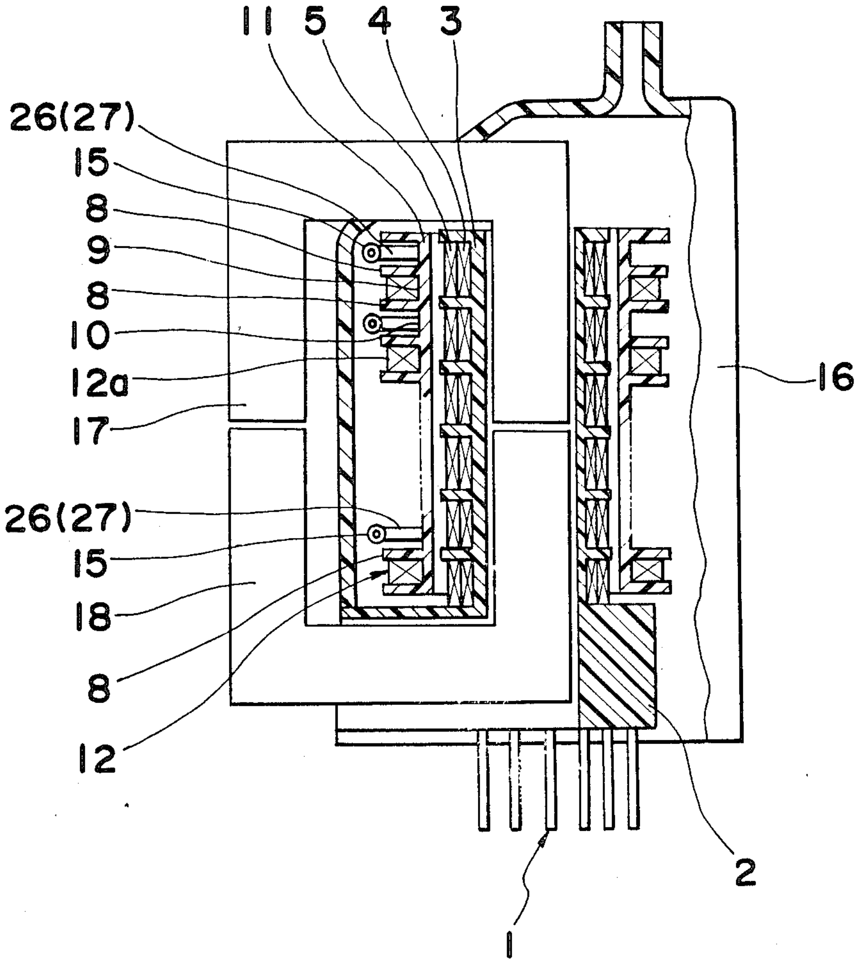
Fig. 1 PRIOR ART
FIG. 1 is a cross-sectional view of a flyback transformer according to the prior art.
Figure 2:
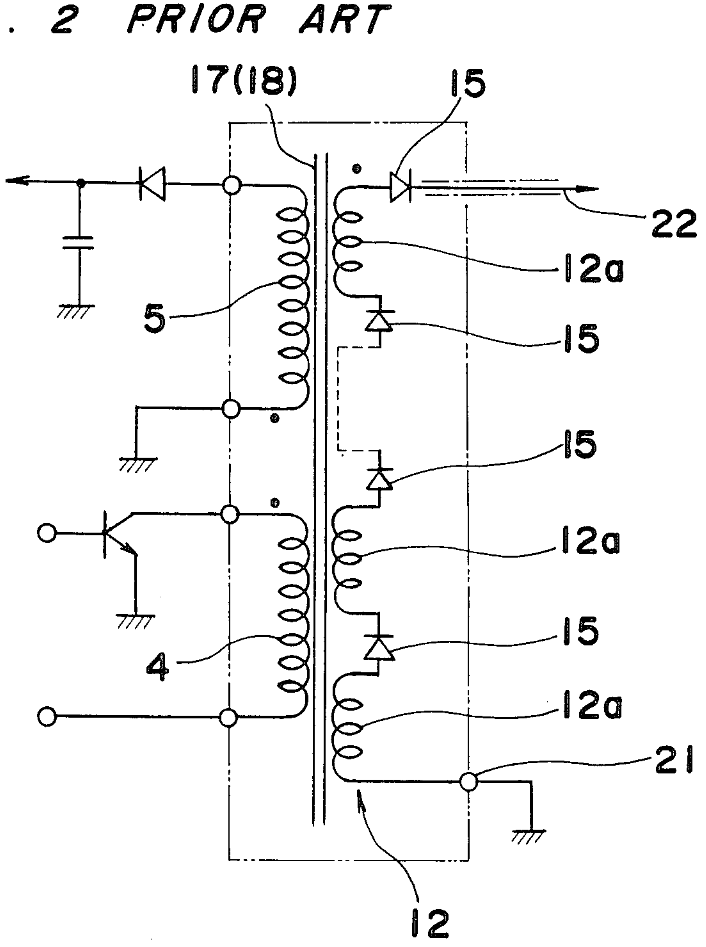
Fig. 2 PRIOR ART
FIG. 2 is a circuit diagram showing an equivalent circuit of the flyback transformer of FIG. 1.

The present invention can be applied, not only to the flyback transformer indicated in FIGS. 1 and 2, but can be applied to any other types, such as a type using only one diode to rectify the output of the secondary winding, a type which employs a diode between ground pin 21 and secondary winding 12, or a type which has no diode between line 22 and secondary winding 12.

Furthermore, the present invention can be applied to a flyback transformer which uses diodes having no lead wires. In this case, it is not necessary to provide grooves 36 and 37 in holders 32 and 33, respectively.

According to the present invention, since holders 32 and 33 are provided with steps 34 and 35, respectively and, at the same time, the diode body is pressure fitted between opposite arms 32*b* and 33*b* and between opposite arms 32*c* and 33*c*, the diode body can be properly held in position even when the lead wires extending from the diode body are bent. Also, the distance between holders 32 and 33 can be made relatively short and, therefore, the size of the flyback transformer can be reduced.

Although the present invention has been fully described with reference to several preferred embodiments, many modifications and variations thereof will now be apparent to those skilled in the art, and the scope of the present invention is therefore to be limited not by the details of the preferred embodiments described above, but only by the terms of the appended claims.

What is claimed is:

1. An element installation arrangement for installing an element of a type having an elongated body with two opposite ends and side portions between said ends, in a flyback transformer comprising: a bobbin;

a first holder mounted on said bobbin; and a second holder mounted on said bobbin in a predetermined spaced relationship with said first holder;

said first holder having a first surface facing said second holder and a first step formed between said first surface and said bobbin;

said second holder having a second surface facing said first holder and a second step formed between said second surface and said bobbin;

said respective surface and step in each of said first and second holders defining an angle that is no greater than a right angle;

said first and second steps being formed between said first and second surfaces; and said first and second holders being configured and dimensioned for such element being pressure fitted between said first and second surfaces with such side portions of such element adjacent the opposite ends of such element being seated on said first and second steps.

2. An element installation arrangement as claimed in claim 1, wherein each of said first and second steps has a V-shaped recess.

3. An element installation arrangement as claimed in claim 1, wherein each of said first and second steps has an arcuate recess.

4. An element installation arrangement as claimed in claim 1, wherein each of said first and second steps is flat.

5. An element installation arrangement as claimed in claim 1, wherein each of said first and second steps has a polygonal recess.

6. An element installation arrangement as claimed in claim 1, wherein said first and second surfaces are slanted such that the distance between said first and second surfaces at one end portion thereof remote from said bobbin is slightly smaller than a length of such element, and is gradually widened toward said first and second steps.

7. An element installation arrangement as claimed in claim 1, wherein said first and second surfaces are parallel to each other such that the distance between said first and second surfaces is no greater than substantially equal to, and no less than slightly smaller than, a length of said element.

8. An element installation arrangement as claimed in claim 1, wherein said first holder comprises a base portion and a pair of arms extending parallelly from said base portion with a predetermined space defined between said arms, said arms defining said first surface.

9. An element installation arrangement as claimed in claim 1, wherein said second holder comprises a base portion and a pair of arms extending parallelly from said base portion with a predetermined space defined between said arms, said arms defining said second surface.

10. An element installation arrangement for installing an element in a flyback transformer comprising: a bobbin;

a first holder mounted on said bobbin; and a second holder mounted on said bobbin in a predetermined spaced relationship with said first holder;

said first holder having a first surface facing said second holder and a first step formed between said first surface and said bobbin, said first step further being formed between said first surface and said second holder;

said second holder having a second surface facing said first holder and a second step formed between said second surface and said bobbin, said second step further being formed between said second surface and said first holder; and said respective surface and step in each of said first and second holders defining an angle that is no greater than a right angle.

* * * * *